United States Patent
Biber et al.

(10) Patent No.: US 8,217,654 B2
(45) Date of Patent: Jul. 10, 2012

(54) MAGNETIC RESONANCE TOMOGRAPHY DEVICE WITH LOCALIZATION SYSTEM AND METHOD TO LOCALIZE A LOCAL COIL

(75) Inventors: Stephan Biber, Erlangen/Frauenaurach (DE); Peter Heubes, Poxdorf (DE); Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 292 days.

(21) Appl. No.: 12/683,587

(22) Filed: Jan. 7, 2010

(65) Prior Publication Data

US 2010/0176809 A1 Jul. 15, 2010

(30) Foreign Application Priority Data

Jan. 9, 2009 (DE) .......................... 10 2009 004 183

(51) Int. Cl.
*G01V 3/00* (2006.01)
(52) U.S. Cl. ........................................ 324/318; 324/309
(58) Field of Classification Search .......... 324/300–322; 600/407–445
See application file for complete search history.

(56) References Cited

U.S. PATENT DOCUMENTS

| | | | |
|---|---|---|---|
| 6,298,259 B1 * | 10/2001 | Kucharczyk et al. | 600/411 |
| 6,492,814 B1 * | 12/2002 | Watkins et al. | 324/318 |
| 6,542,768 B1 | 4/2003 | Kuth et al. | |
| 6,704,593 B2 * | 3/2004 | Stainsby et al. | 600/413 |
| 6,725,077 B1 * | 4/2004 | Balloni et al. | 600/410 |
| 7,218,109 B2 | 5/2007 | Campagna | |
| 7,383,075 B2 * | 6/2008 | Vu | 600/410 |
| 7,962,019 B2 * | 6/2011 | Seeber et al. | 392/416 |
| 2005/0245811 A1 | 11/2005 | Scheffler | |
| 2006/0074290 A1 * | 4/2006 | Chen et al. | 600/407 |
| 2008/0290870 A1 | 11/2008 | Misic | |
| 2011/0301448 A1 * | 12/2011 | deCharms | 600/410 |

* cited by examiner

Primary Examiner — Brij Shrivastav
(74) Attorney, Agent, or Firm — Schiff Hardin LLP

(57) ABSTRACT

A magnetic resonance tomography device has a magnet system that generates a gradient field; with a local coil that receives a magnetic resonance signal; and with a localization system that is fashioned to locate the local coil. The localization system has a number of magnetic field sensors that are integrated with the local coil and fashioned to detect the gradient field. Such a device is used in a corresponding method for localization of a local coil in a magnetic resonance tomography device, and a local coil is fashioned so as to be suitable for this purpose.

17 Claims, 3 Drawing Sheets

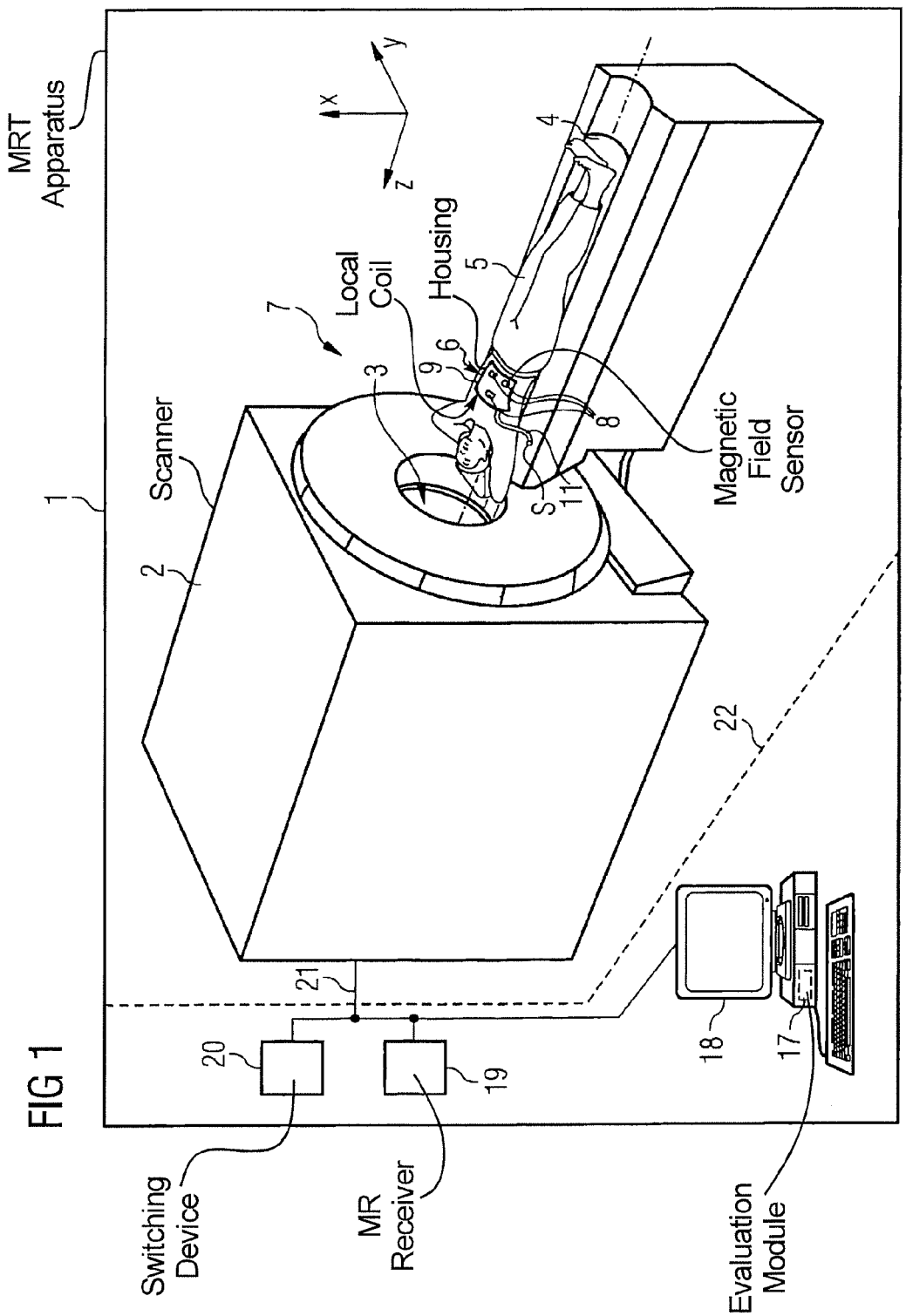

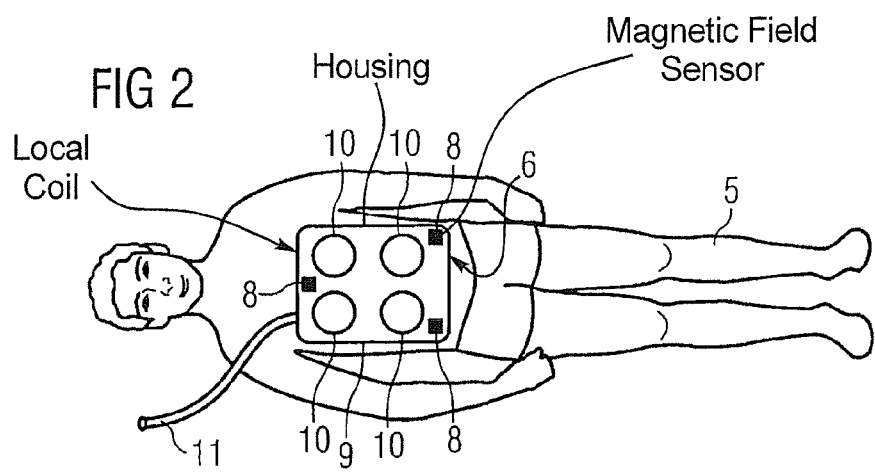
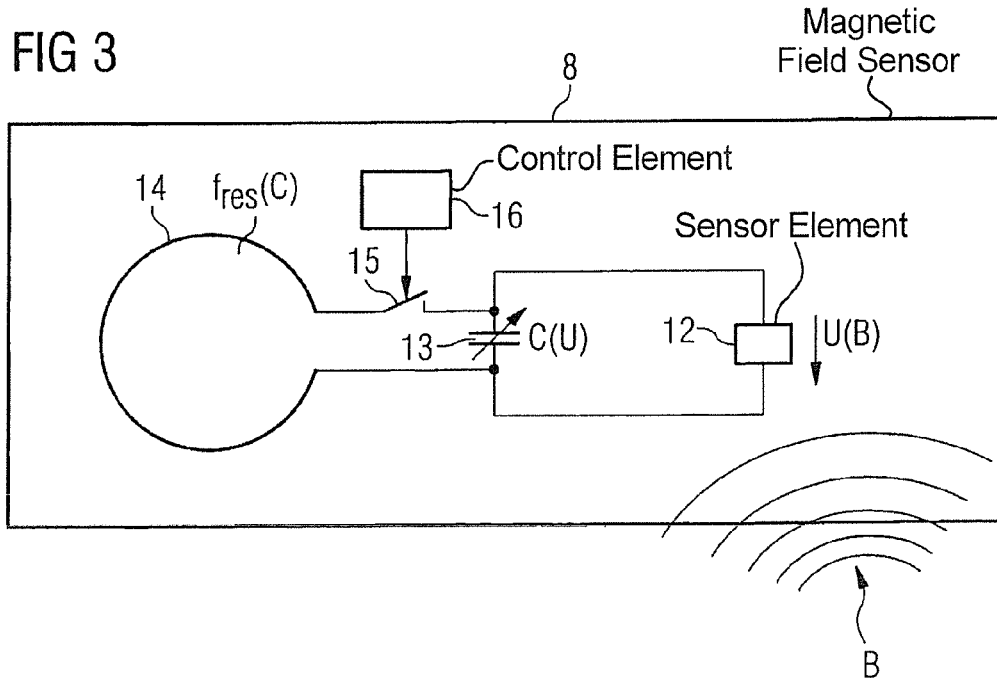

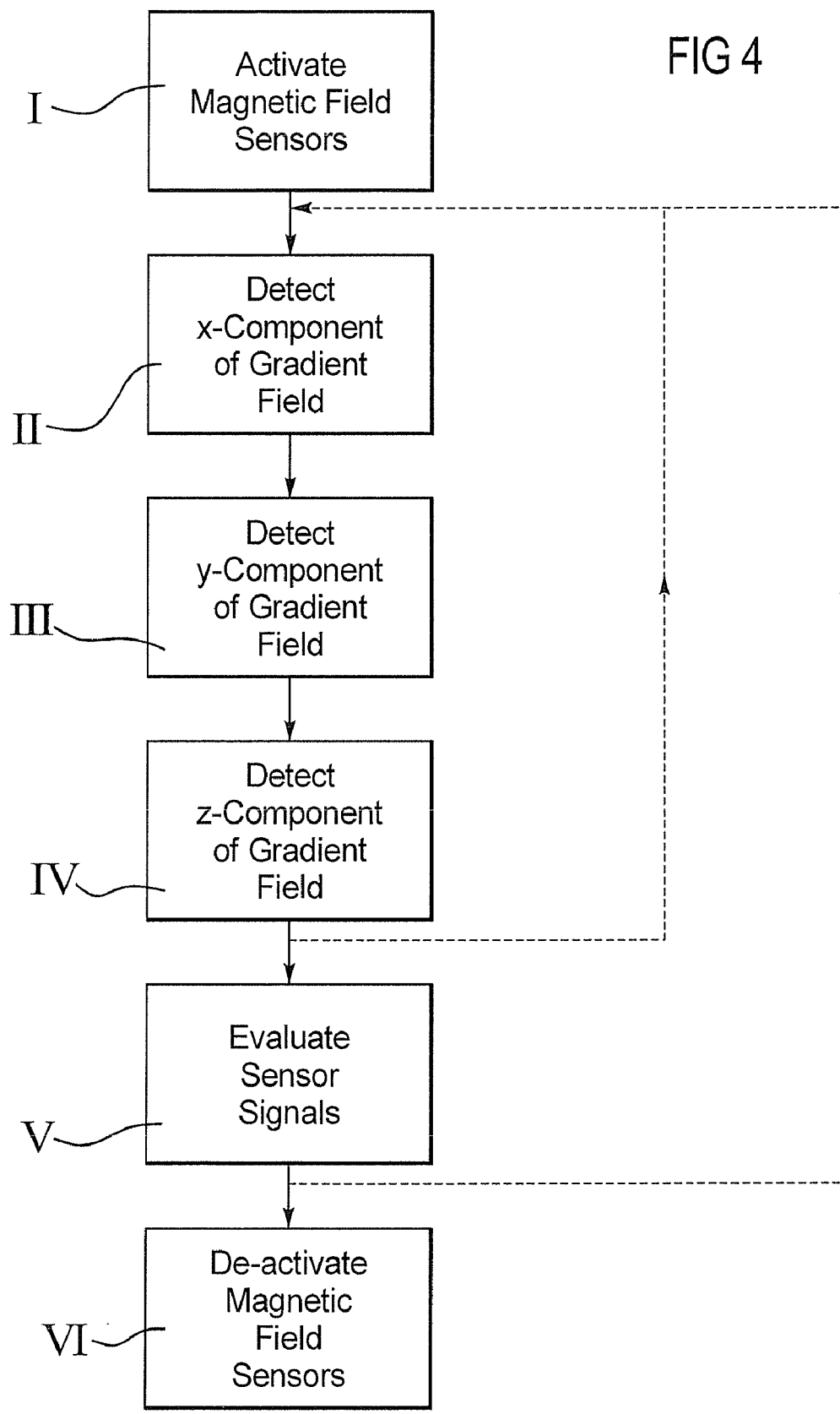

MAGNETIC RESONANCE TOMOGRAPHY DEVICE WITH LOCALIZATION SYSTEM AND METHOD TO LOCALIZE A LOCAL COIL

BACKGROUND OF THE INVENTION

1. Field of the Invention

The invention concerns a magnetic resonance tomography device of the type having a magnet system that is fashioned to generate a gradient field; with a local coil that is fashioned to receive a magnetic resonance signal; and with a localization system that is fashioned to localize the local coil. Moreover, the invention concerns a method to localize a local coil in such a magnetic resonance tomography device, as well as a local coil suitably fashioned for this purpose.

2. Description of the Prior Art

Magnetic resonance tomography (also called MRT) is a technique in widespread use for the acquisition of images of the inside of the body of a living examination subject. In order to obtain an image with this method, i.e. to generate a magnetic resonance exposure of an examination subject, the body or the body part of the patient that is to be examined must be exposed to an optimally homogeneous, static basic magnetic field, which is generated by a basic field magnet of the magnet system of the magnetic resonance tomography device. Rapidly switched gradient fields for spatial coding that are generated by gradient coils of the magnet system are overlaid on this basic magnetic field during the acquisition of the magnetic resonance images. Moreover, RF pulses of a defined field strength are radiated into the examination volume (in which the examination subject is located) with a radio-frequency antenna of the magnetic resonance tomography device. For this purpose, the magnetic resonance tomography device typically has a permanently installed radio-frequency antenna (known as a whole-body coil). The nuclear spins of the atoms in the examination subject are excited by means of these RF pulses such that they are deflected out of their equilibrium state (which runs parallel to the basic magnetic field) by what is known as an "excitation flip angle". The nuclear spins then process around the direction of the basic magnetic field. The magnetic resonance signals that are thereby generated are generally detected by a non-stationary local coil and made accessible for a further processing. The local coil is arranged optimally close to the patient, for example it is placed on the surface of the patient or test subject, and typically has one or more MRT antennas or antenna coils. For additional processing of the detected magnetic resonance signals it is useful to know the position of the local coil as precisely as possible.

Since the MRT device has no a priori knowledge about the orientation or position of the non-stationary local coil on the bed or on the patient, this must initially be "searched for". The position of the local coil in the coordinate system of the MRT device is typically sought or determined by magnetic resonance experiments. The elements of the MRT device that are used form a localization system to localize the local coil. The patient bed with the patient located thereon and the non-stationary local coils arranged on the patient are brought into different z-positions along the longitudinal direction of the measurement space within a measurement space (bore) of the MRT device (thus within the magnet system) and a magnetic resonance data acquisition is conducted at the respective z-positions. The orientation or position of the non-stationary local coils can be automatically calculated within certain precision limits from the overview MRT image that is obtained in this manner if a characteristic antenna profile of the MRT antenna contained in the local coil is known.

In this method for localization of the local coil, however, ambiguities that can be caused by (for example) MRT antennas located very close to one another within a local coil pose difficulties. A localization that is implemented in this manner is additionally problematical if the local coil is located outside or at the edge of the homogeneity volume.

To solve this problem, methods could also be used in which the position of the local coil does not first need to be sought with the use of an overview image MRT image, for example. In such methods, MRT-visible markers integrated into the local coil could be used, but these cause additional problems. Namely, if 1H nuclei are used in such a marker, such a marker will then also be visible in the in the MRT image in the subsequent patient examination and will cause artifacts such as aliasing in the phase coding directions. If a marker with a different nucleus (for example a 19F nucleus) is alternatively used, the entire MRT device must be operated at the resonant frequency of this nucleus, which can only be done with additional cost even for nuclei that are very close to the 1H nucleus in terms of resonant frequency (for example the aforementioned 19F nucleus). Again, different methods would have to be adapted with regard to their MRT compatibility, and in many cases no synergies would be present between autarchic systems and the MRT device.

SUMMARY OF THE INVENTION

An object of the present invention is to further develop a magnetic resonance tomography device of the aforementioned type and a method for localization of a local coil in a magnetic resonance tomography device, and to develop a local coil suitable for this purpose in order to achieve an optimally simple solution based on synergies with existing components of the MRT device.

According to the invention, the magnetic resonance tomography device has a localization system that has a number of magnetic field sensors that are integrated with the local coil and are fashioned to detect the gradient field.

Furthermore, in a method according to the invention for the localization of a local coil it is provided that the localization ensues with the use of a number of magnetic field sensors that are integrated with the local coil and are fashioned to detect the gradient field.

Furthermore, according to the invention a local coil has a number of magnetic field sensors integrated with the local coil that are fashioned to detect a gradient field generated by a magnet system of the magnetic resonance tomography device.

The use of at least one magnetic field sensor is advantageous because the position of the magnetic field sensor can be directly concluded from the strength of the magnetic field acting on it if/when characteristic and the characteristic of the gradient field are known. Such a magnetic field sensor can, be arranged for example, on or in the local coil or—in other words—be installed in a housing of the local coil or be attached to the housing, both of which are encompassed within the term "integrated with the local coil". With regard to the number of the magnetic field sensors, it is noted that the invention can in principle also be realized with a single magnetic field sensor, such that the position of the local coil can be determined in a global manner. However, if multiple magnetic field sensors are present that, for example, are integrated with the local coil at various points, a significantly more precise determination of the position—and possibly even a determination of the bearing or orientation—of the local coil can be achieved. In the present invention, the synergy is achieved by the magnet system that is already present in the MRT device being used as a signal source for the magnetic field that can be detected by the magnetic field sensor, and thus an a priori knowledge exists pertaining to the parameters of the magnetic field that is generated (in particular pertaining to the parameters of the gradient field and its curve). This a priori knowledge can advantageously be used in the evaluation of the sensor signals. In particular, existing components and functionalities of the MRT device can largely be used in accordance with the invention, such that additional and possibly also costly system technologies for position finding or localization of markers can also be foregone.

The MRT device has an evaluation device that is fashioned for the evaluation of a sensor signal (which is generated with the use of magnetic field sensors during operation) with regard to at least one spatial coordinate. Since primarily the z-component of the gradient field is relevant for localization of the local coil in the z-direction, the evaluation can be targeted solely at that direction However, as is explained further in the following, it can also be advantageous when additional components (for example the x- and y-components) of the gradient field are taken into account in the evaluation of the sensor signal, because the precision of the localization of the local coil is then improved.

For this purpose the localization system can have a switching device that is fashioned for a temporally sequential activation and deactivation of the gradient field in one of the three respective spatial directions. One of the three spatial components (x-, y- and z-component) of the gradient field is respectively activated and deactivated again in series. The magnetic field changes or absolute values of the magnetic field that are measured by the respective magnetic field sensor respectively represent the three spatial coordinates of the sensor. In this case as well a notable synergy is achieved because the MRT device already has such a switching device with which the gradient fields for the acquisition of image data or raw data are switched. Such a switching device is typically a component of a central controller that has at least one computer on which software is executed and comprises corresponding electronic modules with whose help signals (for example control signals or reception signals) can be exchanged between the computer and the tomograph (scanner) or its magnet system and/or the local coil. For example, a synchronization between the switched components of the gradient field and the received sensor signals or their processing is achieved with the use of this central controller.

Since the local coil is not always placed in a defined orientation on or near the patient, it has proven to be advantageous when the number of magnetic field sensors are fashioned to detect three components of the gradient field. Three magnetic field-sensitive sensor elements are advantageously fashioned and arranged for this purpose so that in total three linearly independent components of the gradient field can be detected. Advantageously, one of the three orthogonal components of the gradient field can be measured by each sensor element, meaning that at least one sensor element for measurement is associated with each orthogonal component of the gradient field. For example, three similarly designed magnetic field-sensitive sensor elements that are aligned orthogonal to one another and that form a three-dimensional magnetic field sensor can be used per magnetic field sensor. With the use of such a three-dimensional magnetic field sensor and with the aid of the static, z-aligned basic magnetic field, the z-component of the gradient field can be calibrated from the sensor signals of the magnetic field sensors. As an alternative, a configuration to detect the three components of the gradient field can also be realized via three separate magnetic field sensors that respectively possess a single magnetic field-sensitive sensor element and, as described, are arranged orthogonal to one another.

As already mentioned above, the electrical response of a magnetic field sensor is based on the effect of the magnetic field on the material or the respective material composition of the magnetic field sensor. Magnetically hard and soft materials or other solids such as semiconductors or resistance layers are typical. Assuming that the respective physical effect has an effect, magnetic field sensors can be categorized as follows: AMR sensors are based on the anisotropic magnetoresistive effect. Other magnetic field sensors use the effect known as "giant magnetoresistance" and are therefore designated as GMR sensors. The Wiegand effect is also used to realize magnetic field sensors designated as Wiegand sensors. Galvanometric effects in turn play a role in Hall sensors or field plates. Therefore the most varied realizations are considered as magnetic field sensors; attention should be paid to compatibility with the magnetic resonance tomography method. According to a preferred exemplary embodiment of the invention, however, one of the magnetic field sensors is formed with at least one Hall sensor that forms a magnetic field-sensitive sensor element of the magnetic field sensors. A single sensor element or multiple such sensor elements can be provided. GaAs transistors that change their properties (such as direct voltage response or RF response) under the effect of magnetic fields with relatively high field strength (see Proc. Intl. Soc. Mag. Reson. Med. 16 (2008) "Influence of magnetic filed on preamplifiers using GaAs FET technology") are also suitable as possible alternatives (without being exhaustive, however).

In order to make sensor signals accessible to the central controller or an evaluation module, the transfer of sensor signals between the local coil and the central controller can ensue via already existing cables of the local coil with which the local coil can be connected to the MRT device. However, in order to avoid an additional expenditure in the already existing wiring, it has proven to be advantageous for the magnetic field sensors of the local coil to be fashioned for wireless signal transmission between them and a magnetic resonance signal receiver system of the magnetic resonance tomography device. Such a magnetic resonance signal receiver system is used to receive the magnetic resonance signal in the MRT device. The cited whole-body coil, the local coils that are used, and a receiver electronics unit (for example a radio-frequency receiver) coupled with the respective coils typically belong to such a magnetic resonance signal receiver system. For this purpose, the magnetic field sensor fashioned for wireless signal transfer has at least one magnetic field-sensitive sensor element that is coupled with an oscillating circuit. The oscillating circuit thereby serves a double purpose. The magnetic field sensor can be "charged" with energy by a radio-frequency signal, thus be excited to oscillate. This typically ensues with the used of the radio-frequency antenna of the tomography scanner. Moreover the oscillating circuit allows a wireless emission of a signal as soon as the radio-frequency signal is deactivated. The previously stored energy is thereby emitted. However, depending on the gradient field acting on the sensor element, the sensor element coupled with the oscillating circuit affects the frequency at which the oscillating circuit oscillates. The signal emitted by the oscillating circuit is then received with the whole-body coil and/or the local coils that are used, and a corresponding signal is relayed via the receiver electronic unit to an evaluation module of the localization system. The number of wired signal connections can thus be reduced or, respectively, maintained, and a corresponding synergy with existing components of the MRT device can be achieved.

According to a preferred exemplary embodiment of the invention, the number of magnetic field sensors are fashioned such that they can be activated or deactivated. This measure is particularly advantageous given use of magnetic field sensors functioning wirelessly, because possible interference by the magnetic field sensors in a normal acquisition of image or raw data is thereby avoided.

BRIEF DESCRIPTION OF THE DRAWINGS

FIG. 1 schematically illustrates a magnetic resonance tomography apparatus according to an exemplary embodiment of the invention.

FIG. 2 schematically illustrates a local coil with three magnetic field sensors that is placed on a patient.

FIG. 3 is a basic circuit diagram of an exemplary embodiment of a magnetic field sensor fashioned for wireless signal transmissions.

FIG. 4 is a flow chart of an exemplary embodiment of the method according to the invention.

DESCRIPTION OF THE PRIOR ART

A magnetic resonance tomography apparatus 1 (that is abbreviated in the following as an MRT apparatus 1) is shown FIG. 1, wherein only those components which are necessary to describe the invention are shown in detail. For the purpose of orientation, the coordinate system of the MRT apparatus 1 is shown with the x-direction, y-direction and z-direction.

The MRT apparatus 1 has a scanner that accommodates the stationary magnet system (not explicitly shown) of the MRT device 1. The scanner 2 has a measurement space 3 that is also known as a "bore" in the technical jargon. A bed 4 on which a patient 5 is positioned can be inserted into this measurement space 3 in order to acquire raw data in this position for the reconstruction of volume image data. For this purpose a magnetic resonance signal is generated in the tissue of the body of the patient 5 with the use of the stationary magnet system. This magnetic resonance signal is received with the use of a local coil 6. However, since the optimal evaluation capability of the raw data assumes a precise knowledge of the position of the local coil 6, the MRT apparatus 1 has a localization 7 with which the localization of the local coil 6 is implemented, which is discussed in detail in the following. The position of the local coil 6 is thereby typically determined relative to a reference point of the magnet system of the scanner 2, or of the MRT apparatus 1.

In the present case, the localization system 7 has, for example, three magnetic field sensors 8 that are integrated with the local coil 6 and are fashioned to detect the gradient field generated with the aid of the magnet system. In the present case, each of the magnetic field sensors 8 has a Hall sensor. Details of the local coil 6 placed on the patient 5 that pertain to this fact are presented schematically in FIG. 2. The local coil 6 has a housing 9 in which four antenna coils 10 are accommodated to detect the magnetic resonance signals originating from the tissue of the patient 5. Furthermore, the three magnetic field sensors 8 are accommodated in the housing 9. The local coil 6 furthermore has a cable 11 with which it can be electrically connected with the MRT apparatus 1 so that electrical signals which represent the magnetic resonance signal received with the antenna coils 10 can be made accessible for further processing in the sense of the acquisition and evaluation of the raw data.

The localization system 7 furthermore has a switching device 20 that is fashioned for temporally sequential activation and deactivation of the gradient field in one of the three spatial directions x, y and z. Therefore, the individual gradient fields can be activated or deactivated sequentially in the x-direction, y-direction and z-direction so that corresponding magnetic field changes, which are used to determine the position of the local coil 6 appear at the respective Hall sensor. The switching device 20 is coupled via a signal bus 21 with the scanner 2 in order to correspondingly activate the magnet system. The switching device 20 receives its control signals from a computer 18.

Depending on the respective field strength of the respective active gradient field, each of the Hall sensors delivers a sensor signal S that is output to the MRT apparatus 1 via the cable 11. The measured magnetic field changes represent the three spatial coordinates x, y and z of the respective magnetic field sensor 8.

In order to evaluate the different sensor signals S of the magnetic field sensors 8, the localization system 7 possesses an evaluation module 17. The evaluation module 17 is realized with the aid of software that is executed on the computer 18. The computer 18 is furthermore connected with the tomograph 2 via the signal bus 21 so that the sensor signals S are also received from the scanner 2 via this signal bus 21. In the evaluation, a known, analytical description of the gradient curve of the gradient fields with which the sensor signals S are compared is assumed. For this the switching device 20 is appropriately controlled from the computer for a localization procedure.

The computer 18 furthermore serves for the synchronization of the different workflows in the detection and evaluation of the raw data, the control of the magnet system, the control of the positioning of the bed 4, and additional processes that are typical in tomography (but which are not discussed in more detail because they do not pertain to the invention).

According to a special exemplary embodiment, the three Hall sensors can have the same orientation, wherein in a typical orientation of the local coil 6 (for example a perfect alignment in the z-direction) its respective surface normal is oriented in the z-direction so that the Hall sensors only detect the z-component of the gradient field.

However, in operation it can occur that the local coil 6 is not perfectly aligned in its z-direction. However, since only the z-component of the three gradient fields is relevant, these must be evaluated separately. In order to enable this, in a further exemplary embodiment the magnetic field sensor 8 is realized with the use of three sensor elements (for example Hall sensors). The three sensor elements are aligned orthogonal to one another and form a three-dimensional magnetic field sensor 8. In operation, with the aid of the three-dimensional magnetic field sensor 8 in addition to or, respectively, independent of the previously described use of three gradient fields, the static basic magnetic field generated with the aid of the magnet system (which static basic magnetic field is oriented in the z-direction in the homogeneity volume of the measurement space) is used to calibrate out the z-component of the magnetic field sensors 8.

Furthermore, in operation may be the case that it is initially unclear whether the local coil 6 is already localized within a homogeneity volume of the magnet system or not. An ambiguity with regard to the position of the local coil 6 can thus occur because the curve of the gradient field outside of the homogeneity volume changes in comparison to the curve within the homogeneity volume. In a preferred exemplary embodiment, this circumstance can be taken into account in that magnetic field measurements are already begun upon driving the patient 5 into the measurement space 3, thus when the local coil 6 is still outside of the measurement space 3, but in particular is outside of the homogeneity volume. Multiple magnetic field measurements are accordingly conducted along the z-direction, wherein the three components of the gradient field are repeatedly switched through in series (for example respectively, sequentially activated and deactivated) during the movement of the bed 4 along the z-direction. Through evaluation of the sensor signals S, a function graph of the measured field curve results for every magnetic field sensor 8 depending on the z-position of the bed 4 (which is sufficiently known). The received sensor signals S that represent the respective activated gradient field can be adapted to the a priori analytically known curve of the gradient fields via suitable adaptation algorithms (for example the method of least square deviations, also called "least square fitting"), from which the exact z-position (for example the absolute position in the coordinate system of the MRT apparatus 1 or the relative position in relation to the known position of the bed 4) of the local coil 6 can be derived.

In order to avoid or to reduce problems with ambiguities in the determination of the position of the local coil 6, the position of the bed 4 (which is known a priori because the position is controlled via the computer 18) can also be taken into account as assistance. However, it has proven to be particularly advantageous when not only the z-component of the gradient field but also the x-component and/or y-component are also taken into account. These additional components can be detected both with the use of only a single sensor element that has an arbitrary alignment (and thus is exposed to the effect of these components) and given use of the three-dimensional magnetic field sensor 8. The additional components deliver the missing information that is necessary given adaptation (fitting) of the sensor signals S to the a priori known curve of the gradient field in order to obtain unambiguous results regarding the position of the local coil 6.

As was explained above, the cable 11 can be used for signal transmission of the sensor signals S. According to a preferred exemplary embodiment, however, the magnetic field sensors 8 are fashioned for wireless signal transmission between them and a magnetic resonance signal receiver system (abbreviated in the following as an MR receiver system) of the MRT apparatus 1. The MR receiver system typically has at least one permanently installed antenna (whole-body antenna) of the tomograph 2 that, however, is not shown in detail, or (case-specifically) also the local coil 6 or more precisely the antenna coils 10 of the local coil 6 and corresponding electronic components of an MR receiver 19 that are connected with the antenna, for example via the signal bus 21. This is the same MR receiver 19 that is used to receive the magnetic resonance signal in the course of the raw data acquisition. The MR receiver 19 is furthermore coupled with the computer 18 so that the sensor signals S are made accessible to the evaluation module 17.

At this point it is noted that—as is indicated in FIG. 1 by the solid divider line 22—those modules (such as the computer 18, the MR receiver 19 and the switching device 20 in the present case) in an MRT apparatus which optimally should not be exposed to the relatively strong magnetic field of the scanner 2 in operation, are arranged spatially or structurally separate from the tomograph 2. In the present case, these modules 18, 19 and 20 form components of a central controller of the MRT device 1. Although not explicitly shown in FIG. 1, it is noted that the signal bus 21 typically is formed of different conductors shielded from one another.

One possible embodiment of such a wirelessly functioning magnetic field sensor 8 is shown in FIG. 3. The magnetic field sensor 8 has a magnetic field-sensitive sensor element 12 (for example a Hall sensor), a "positive-intrinsic-negative" diode 13 (abbreviated as PIN diode 13), a sensor antenna 14 executed as a loop (also called a loop antenna), as well as a switching element 15 located between the sensor antenna 14 and the PIN diode 13 and a control element 16 coupled with the switching element 15.

The PIN diode 13 that is operated in the blocking direction changes its capacitance value C depending on the voltage U applied to it, which voltage U is dependent in turn on the value of the franking machine B (for example basic magnetic field or gradient field) that acts on the sensor element 12. The PIN diode 13 and the sensor antenna 14 consequently form a resonant oscillating circuit whose resonance frequency $f_{res}$ is dependent on the magnetic field B acting on the sensor element 14. In operation (for which it now assumed that the switching element 15 adopts a conductive state) the oscillating circuit is "charged", or is supplied with energy via a broadband MR transmission pulse generated with the aid of an MR whole-body antenna of the stationary magnet system. After deactivation of this MR transmission pulse, the energy stored in the oscillating circuit is radiated, wherein the frequency of the radiated signal is proportional to the magnetic field B acting on the sensor element B, thus is proportional to the spatially dependent gradient field for example.

In order to ensure that no magnetic resonance signal interferes with this type of wireless signal transmission or vice versa, the resonance frequency $f_{res}$ of the oscillating circuit is allocated a few hundred kHz in addition to the frequency of the magnetic resonance signal. However, in order to also ensure that the respective magnetic field sensor 8 does not interfere in the normal acquisition of raw data, the switching element 15 can be switched between a conductive state and a non-conductive state. The switching element 15 is formed, for example, by a transistor that is coupled with the control element 16. The control element 16 is in the present case realized by an RF detector that is fashioned to detect a radio-frequency subcarrier, for example. The subcarrier is generated by the MRT device 1, wherein the present transmission path (i.e. the present radio-frequency amplifier and, for example, the present whole-body coil) but also a separate transmission path (which comprises an additional, separate radio-frequency amplifier and the present whole-body coil or even one or more separate, additional antennas, for example) can be used for this purpose. Given the presence of the subcarrier, energy for the switching element 15 is provided in an electromagnetic manner with the aid of the RF detector, and the conductive state of the switching element 15 is established. Given an absence of the subcarrier, the blocking state of the switching element 15 is established due to the discontinuation of the electrical supply, and thus the magnetic field sensor 8 is switched into a non-functioning state because the oscillating circuit is disconnected. However, at this point it is noted that the energy for the operation of the switching element 15 and/or a corresponding control signal to adopt the conductive or blocking state can also be provided via the cable 11.

With the measures described in the preceding, a method according to the invention can be executed or implemented in the operation of the MRT device 1, in which method the localization of the local coil 6 ensues with the use of a number of magnetic field sensors 8 that are integrated with the local coil 6 and are fashioned to detect the gradient field. The sensor signal S generated by the magnetic field sensors 8 is evaluated with regard to the z-coordinates, wherein the gradient field is sequentially activated and deactivated in one of the three respective spatial directions for the purpose of generating the sensor signal S.

This method is shown in a very schematic manner in FIG. 4 and begins in Block I with the switching on (activation) of the magnetic field sensors 8. In Block II, the gradient field in the x-direction is activated or, respectively, deactivated, and the sensor signal S received in the activated state is transmitted to the evaluation module 17. In Block III, the gradient field in the y-direction is subsequently activated or deactivated, and the sensor signal S received in the activated state is transmitted to the evaluation module 17. Finally, in an analogous manner in Block IV the gradient field in the z-direction is activated or deactivated and the sensor signal S obtained in the activated state is transmitted to the evaluation module 17. These method steps II through IV can already begin when the bed 4 is still outside of the measurement space 3 or outside of the homogeneity volume of the magnet system, and are repeated as often as necessary in order to acquire sufficient measurement data during the movement of the bed 4. The evaluation of the received sensor signals S ensues in Block V. It can already ensue after a single pass of the method steps II through IV, or only after a number of passes of the method steps II through IV, which is visualized with the aid of the two indicated loops. The method ends in Block VI with the switching off (deactivation) of the magnetic field sensors 8.

However, it is noted that the group-by-group activation and deactivation of the magnetic field sensors 8 can also ensue at other points of the method, or every individual magnetic field sensor 8 can be activated and deactivated independently of the other magnetic field sensors 8. It is noted that the sensor signal S represents the items of measurement information of the individual sensor elements 12 of the respective magnetic field sensor 8 or of the magnetic field sensors 8. These items of measurement information can be differentiated from one another by suitable measures (for example modulation or coding).

The method described in detail and the MRT device shown in the preceding are merely exemplary embodiments which can be modified in the most varied ways by those skilled in the art without departing from the scope of the invention. The invention was explained predominantly using an operation in a medically utilized MRT device, but it is not limited to such uses. It can also be used in scientific and/or industrial operations.

We claimed as our invention:

1. A magnetic resonance tomography apparatus comprising:
   a magnetic resonance data acquisition unit operable to acquire magnetic resonance data from a subject in the data acquisition unit, said data acquisition unit comprising a gradient coil system operable to generate a gradient field in the data acquisition device;
   said data acquisition system comprising a local coil configured to receive a magnetic resonance signal excited in the examination subject when said local coil is located in the data acquisition unit; and
   a localization system configured to identify a location of the local coil relative to the data acquisition unit, said localization system comprising a plurality of magnetic field sensors integrated with said local coil and configured to detect said gradient field and to emit a sensor signal representing a characteristic of said gradient field, and a computerized evaluation module supplied with said sensor signal and configured to evaluate said sensor signal to identify said location of said local coil relative to said data acquisition unit.

2. A magnetic resonance tomography apparatus as claimed in claim 1 wherein said evaluation module is configured to evaluate said sensor signal with regard to at least one spatial coordinate of said gradient field.

3. A magnetic resonance tomography apparatus as claimed in claim 1 wherein said localization system comprises a switching device configured to temporally sequentially activate and deactivate said gradient field in one of three spatial directions thereof.

4. A magnetic resonance tomography apparatus as claimed in claim 1 wherein said magnetic field sensor comprises three magnetic field-sensitive sensor elements that respectively detect three orthogonal components of said gradient field, each of said sensor elements detecting one of said orthogonal components of said gradient field.

5. A magnetic resonance tomography apparatus as claimed in claim 1 wherein said magnetic field sensor is selected from the group consisting of Hall sensors and GaAs transistors.

6. A magnetic resonance tomography apparatus as claimed in claim 1 wherein said magnetic field sensors each comprise a wireless signal transmitter, and wherein said evaluation module comprises a wireless signal receiver, allowing said sensor signal to be wirelessly transmitted between said magnetic field sensors and said evaluation module.

7. A magnetic resonance tomography apparatus as claimed in claim 1 wherein said magnetic field sensors are operable to be activated and deactivated dependent on operation of said data acquisition unit.

8. A method to identify a position of a local coil of a magnetic resonance data acquisition unit that is operable to acquire magnetic resonance data from a subject in the data acquisition unit, said data acquisition unit comprising a gradient coil system operable to generate a gradient field in the data acquisition device, said method comprising the steps of:
   with a plurality of magnetic field sensors integrated with said local coil, detecting said gradient field and emitting a sensor signal representing a characteristic of said gradient field; and
   in a computerized evaluation module supplied with said sensor signal, evaluating said sensor signal to identify the location of said local coil relative to said data acquisition unit.

9. A method as claimed in claim 8 comprising evaluating said sensor signal in said evaluation module with regard to at least one spatial coordinate of said gradient field.

10. A method as claimed in claim 8 comprising temporally sequentially activating and deactivate said gradient field in one of three spatial directions thereof.

11. A method as claimed in claim 8 wherein said magnetic field sensor comprises three magnetic field-sensitive sensor elements that respectively detect three orthogonal components of said gradient field and, with each of said sensor elements, detecting one of said orthogonal components of said gradient field.

12. A method as claimed in claim 8 comprising selecting said magnetic field sensor is selected from the group consisting of Hall sensors and GaAs transistors.

13. A method as claimed in claim 8 comprising wirelessly transmitting said sensor signal between said magnetic field sensors and said evaluation module.

14. A method as claimed in claim 8 comprising activating and deactivating said magnetic field sensors dependent on operation of said data acquisition unit.

15. A local coil arrangement for magnetic resonance tomography, comprising:
   a local coil resonator configured to detect magnetic resonance signals generated in a data acquisition unit of a magnetic resonance tomography apparatus, said resonator being located at a position relative to said data acquisition unit; and a plurality of magnetic field sensors integrated with said resonator, each of said magnetic field sensors being configured to detect a gradient field generated by said data acquisition unit, each of said magnetic field sensors emitting an output signal representing a value of the gradient field detected by that magnetic field sensor.

16. A local coil as claimed in claim 15 wherein each of said magnetic field sensors comprises a wireless signal transmitter configured to wirelessly transmit said output signal to a location remote from that magnetic field sensor.

17. A local coil as claimed in claim 16 wherein each of said magnetic field sensors comprises at least one magnetic field-sensitive element and an oscillating circuit coupled with said at least one magnetic field-sensitive sensor element, said oscillating circuit being configured to be charged with energy by a radio-frequency signal generated in said data acquisition unit and, after discontinuation of said radio-frequency signal, said oscillating circuit being configured to emit a signal at a frequency that is dependent on the gradient field detected by said at least one magnetic field-sensitive sensor element.

* * * * *